(12) United States Patent
Tiefenbock

(10) Patent No.: US 9,865,492 B2
(45) Date of Patent: Jan. 9, 2018

(54) RECEIVING DEVICE FOR HANDLING STRUCTURED SUBSTRATES

(71) Applicant: EV GROUP E. THALLNER GMBH, St. Florian am Inn (AT)

(72) Inventor: Herbert Tiefenbock, Andorf (AT)

(73) Assignee: EV GROUP E. THALLNER GMBH, St. Florian am Inn (AT)

( * ) Notice: Subject to any disclaimer, the term of this patent is extended or adjusted under 35 U.S.C. 154(b) by 268 days.

(21) Appl. No.: 14/758,675

(22) PCT Filed: Jan. 7, 2014

(86) PCT No.: PCT/EP2014/050121
§ 371 (c)(1),
(2) Date: Jun. 30, 2015

(87) PCT Pub. No.: WO2014/111288
PCT Pub. Date: Jul. 24, 2014

(65) Prior Publication Data
US 2015/0357227 A1    Dec. 10, 2015

(30) Foreign Application Priority Data

Jan. 21, 2013  (DE) .......................... 10 2013 100 563

(51) Int. Cl.
  *B23P 19/00*    (2006.01)
  *H05K 13/04*    (2006.01)
  *H01L 21/683*   (2006.01)
  *H01L 21/687*   (2006.01)

(52) U.S. Cl.
  CPC .... *H01L 21/6838* (2013.01); *H01L 21/68757* (2013.01); *Y10T 29/50* (2015.01)

(58) Field of Classification Search
  CPC ...................... H01L 21/6838; H01L 21/68757
  See application file for complete search history.

(56) References Cited

U.S. PATENT DOCUMENTS 8,633,259 B2 *  1/2014  Rhodes ................. C08K 5/04
                                                      520/1
8,758,552 B2 *  6/2014  Canale ............. H01L 21/67092
                                                      156/707
(Continued)

FOREIGN PATENT DOCUMENTS

CN    102427916 A     4/2012  .......... H01L 21/683
DE    102011088947 A1 6/2012  ............. G03G 15/20
(Continued)

OTHER PUBLICATIONS

International Search Report issued in corresponding International Patent Application No. PCT/EP2014/050121, dated Mar. 3, 2014.

*Primary Examiner* — Paul D Kim
(74) *Attorney, Agent, or Firm* — Kusner & Jaffe

(57) ABSTRACT

A mounting apparatus for handling of a structured substrate which has structures. The mounting apparatus having a soft material layer for accommodating the structured substrate on a receiving surface. The structures of the structured substrate are able to be taken at least partially into the material layer. Fixing means for fixing of the structured substrate on the receiving surface are provided.

11 Claims, 2 Drawing Sheets

(56) References Cited

U.S. PATENT DOCUMENTS

| | | | |
|---|---|---|---|
| 8,888,085 B2* | 11/2014 | Canale | B23Q 3/084 |
| | | | 269/289 R |
| 9,087,873 B2* | 7/2015 | Owada | H01L 21/76251 |
| 9,162,396 B2* | 10/2015 | Coxon | B29C 70/446 |
| 9,202,801 B2* | 12/2015 | Toh | H01L 21/561 |
| 2009/0081852 A1 | 3/2009 | Tanaka et al. | 438/464 |
| 2011/0198817 A1 | 8/2011 | Hurley et al. | 279/3 |
| 2012/0146273 A1 | 6/2012 | Tiefenböck et al. | 269/21 |
| 2012/0156481 A1 | 6/2012 | Moorlag et al. | 428/339 |
| 2012/0234497 A1 | 9/2012 | Han et al. | 156/701 |

FOREIGN PATENT DOCUMENTS

| | | | | |
|---|---|---|---|---|
| EP | 2398040 A1 | 12/2011 | | H01Q 21/00 |
| JP | 2000-021915 A | 1/2000 | | H01L 21/60 |
| JP | 3173464 B2 | 3/2001 | | H01L 21/60 |
| JP | 2003-243344 A | 8/2003 | | H01L 21/304 |
| JP | 2004-259792 A | 9/2004 | | B23Q 3/08 |
| JP | 3832353 B2 | 7/2006 | | H01L 21/304 |

* cited by examiner

RECEIVING DEVICE FOR HANDLING STRUCTURED SUBSTRATES

RELATED APPLICATIONS

This application is a National Stage of International Application No. PCT/EP2014/050121 filed Jan. 7, 2014, which claims the benefit of German Patent Application No. 102013100563.2, filed Jan. 21, 2013.

FIELD OF THE INVENTION

This invention relates to a mounting apparatus for handling structured substrates, and a method for handling structured substrates.

BACKGROUND OF THE INVENTION

Mounting apparatus, also referred to as sample holders, are used in the semiconductor industry for fixing of substrates which are thinned or processed in some other way on the mounting apparatus. The thinning is called back-grinding, and the target thickness of the substrates after back-grinding is in part less than 100 µm, especially less than 50 µm, preferably less than 20 µm. Ever-continuing miniaturization constitutes a major technical problem for handling of substrates, especially since the sample holders which are used for this purpose have extremely flat surfaces so that the fixing of structured substrates on these surfaces is impossible or is only very poorly possible. Furthermore, the back of a substrate, which is opposite the front with the structures, must generally remain flat and should not be undulated and/or arched by the structuring on the front. Mainly, during the back-thinning, the back of the substrate must remain very flat. Otherwise, fracture, nonuniform back-thinning, or other damage to the substrate occurs.

The object of this invention is to devise a mounting apparatus and a corresponding method with which the handling of the aforementioned structured substrates is enabled in back-grinding or other processes, and especially in the detachment of the substrates without damaging them.

This object is achieved with the features of the claims. Advantageous developments of the invention are given in the dependent claims. All combinations of at least two of the features given in the specification, the claims and/or the figures also fall within the scope of the invention. At the given value ranges, values within the indicated limits will also be considered to be disclosed as boundary values and will be claimed in any combination.

The invention is based on the concept of holding structured substrates whose structures are predominantly with a height of greater than 1 µm, preferably predominantly greater than 10 µm, still more preferably predominantly greater than 50 µm, most preferably predominantly greater than 100 µm, such that the structures of the front of the substrate dip completely into a soft material layer with preferably low adhesion so that the back of the substrate remains flat and the substrate can be easily and simply detached again after processing.

According to the invention, a soft material layer is defined as a compliant material layer which is able to accommodate structures. The definition of "soft" does not necessarily relate to the physical parameters of the modulus of elasticity, which describes a compliance of the material in the sense of Hooke's Law, but rather to the capacity to accommodate structures. In one preferred embodiment, the structures sink in the porous and/or fibrous material layer. In all those embodiments in which the definition of "soft" is intended to mean a compliant material in the sense of Hooke's Law, the modulus of elasticity is less than 100 GPa, preferably less than 1 GPa, more preferably less than 100 MPa, most preferably less than 1 MPa, most preferably of all less than 1 kPa.

According to the invention, a low-adhesive material layer is defined as a material layer whose surface has low adhesion to other materials, in particular, produced by nanotechnology. According to the invention, low-adhesion surfaces in the micro range and/or nano range have a lack of flatness whose morphology contributes to low adhesion or even causes it. The use of the so-called lotus blossom effect would be conceivable.

Adhesion capacity designates a certain holding force per $m^2$ which should be as low as possible so that the predominant part of the fixing of the substrate on the receiving surface is caused by fixing means in the fixing section.

If the adhesion between two solids which are joined to one another is to be determined, the energy can be measured, which is necessary to drive a crack through the solid. In the semiconductor industry, the so-called "razor blade test" or "Maszara razor blade test" is often used. This test is a method with which the bonding energy between two solids is determined. Generally, the solids are welded to one another.

In this respect, in order to determine the adhesion capacity of a layer which is to have low adhesion relative to as many other materials as possible, other measurement methods must be used. The measurement method which is used most often is the contact angle method.

The contact angle method is used together with Young's equation in order to draw a conclusion about the surface energy of a solid by using a test liquid.

This qualifies the surface energy of a surface by a certain test liquid, generally by water. Corresponding measurement methods and the evaluation methods are known to one skilled in the art. The contact angle, which is determined using the contact angle method, can be converted to a surface energy in N/m or $J/m^2$. For relative comparisons of different surfaces with the same test liquid, the data of the contact angles are sufficient to obtain a (relative) estimate of the adhesion capacity of the surface. Thus, by using water as the test liquid, it can be maintained that wetted surfaces which produce a contact angle on the water droplet of roughly 30° have a higher adhesion (strictly speaking only to water) than surfaces whose contact angle on the water droplet has roughly 120°.

An embodiment according to the invention will be used mainly, but not exclusively, for temporary fixing of Si thin layer substrates. Therefore, a determination of the surface energy of any low adhesion layer to Si which is used is desirable. Since Si is not liquid at room temperature, as mentioned above, a test liquid (water) is used to characterize the low-adhesion layer with respect to the test liquid. All following contact angle values and/or surface energies are thus values which quantify the low-adhesion layer with respect to a test liquid and allow at least a relative conclusion about the adhesion capacity to other substances, preferably solids, more preferably Si.

The material layer is produced by wet chemical processes with corresponding chemicals, electrolytic deposition, physical deposition from the gaseous phase (PVD), chemical deposition from the gaseous phase (CVD), lamination, plating, cementing, electrolytic deposition or casting. The material layer is preferably comprised of a polymer, more preferably of a silicone, still more preferably of a fluoropolymer, most preferably of all of one of the two materials Swivel or Viton.

Additional fixing of the substrate by a fixing agent which produces a volumetric flow in the material layer, by producing a vacuum in the soft material layer, is provided according to one advantageous and preferred embodiment of the invention. The material layer, therefore, preferably has a porous and/or fibrous structure so that evacuation of the material layer itself leads to a suction of the substrate. A material layer is also conceivable which has holes and/or suction bores and/or suction lines by which suction pressure is produced or intensified. The combination of a layer which has a porous and/or fibrous structure with holes and/or suction bores and/or suction lines is also conceivable. The suction pressure which can be produced by the evacuation of the material layer (difference of the ambient pressure and the pressure in the material layer) is greater than 0.0001 bar, preferably greater than 0.001 bar, more preferably greater than 0.1 bar, most preferably of all greater than or equal to 1 bar. The suction force is found by corresponding multiplication of the suction pressure by the area.

The volumetric flow which is used to suction the substrate is of special interest for this invention. The volumetric flow must be great enough to produce the necessary suction performance for the embedding of the structures of the substrate into the material layer. The volumetric flow counteracts the elastic resistance of the material layer. The volumetric flow is defined as the amount of gas volume which is suctioned per unit of time. At a pressure difference which is kept constant, the volumetric flow is maximized mainly by large pores and/or small fiber densities and/or large holes and/or large suction bores and/or thick suction lines. The volumetric flow is greater than 1 ml/s, preferably greater than 100 ml/s, more preferably greater than 1000 ml/s, most preferably greater than 10 l/s, most preferably of all more than 100 l/s. Since the structures of the substrate are sucked into the material layer by the pressure difference, the corresponding suction performance must be high enough. An overly small volumetric flow would impede the formation of a vacuum between the substrate and the material layer, and thus not draw the structures into the material layer or would do so to an insufficient degree. A correspondingly high volumetric flow, therefore a correspondingly high suction performance, ensures the suction of the substrate, and thus the embedding of the structures into the material layer at first. In order to increase the volumetric flow, holes and/or suction bores and/or suction lines are also worked into the material layer in order to ensure the efficient removal of the air from the porous and/or fibrous material.

An especially high volumetric flow can be established when the substrate does not completely cover the surface and/or the side of the material layer, so that air is also evacuated by the evacuation process via the uncovered area. In order to ensure reliable handling and fixing of the substrate, the volumetric flow in this case is high enough to compensate for leaks which arise due to incomplete covering.

Therefore, the invention is also based on the idea of making holes and/or suction bores and/or suction lines in the material layer of the mounting apparatus such that suction action (suction pressure) as uniform as possible over the entire volume of the material layer on the substrate is enabled. In other words, the mounting apparatus enables a linearly variable, homogenous surface force on the substrate so that the substrate is preferably homogeneously loaded with pressure. Preferably, the surface force acting on the substrate can be controlled by changing the suction pressure in a linear relationship. Alternatively, the fixing means can comprise electrostatic fixing by the material layer being designed accordingly for electrostatic fixing. Preferably, the electrostatic fixing can be controlled by a software-supported control apparatus.

The substrates mostly before and after processing are extremely thin substrates, preferably less than 100 μm thickness, even more preferably less than 50 μm thickness.

Here, the fixing means are made in particular controllable so that upon activation a fixing takes place, and upon deactivation, there is only contact of the substrate with surface of the material layer, while the structures of the substrate preferably remain embedded in the material layer.

According to another advantageous embodiment of the invention, in the deactivated state of the fixing means, a force which is caused by the above described elasticity of the material layer acts on the structures of the substrate and largely normally to the surface of the material layer, and by which force the structures are pressed at least partially out of the material layer.

In other words, the fixing of the substrate on the mounting apparatus takes place exclusively by the application of a vacuum and/or by the structures sinking in the material layer or dipping into it, in particular by more than 20%, preferably more than 40%, even more preferably more than 60%, still more preferably more than 80%, most preferably 100% and in this way the material surrounding them is fixed.

Preferably, the fixing can be enhanced by using a vacuum which produces and/or maintains a vacuum in the material layer by corresponding vacuum feeds under and/or in the material layer so that the air pressure outside loads the substrate normally to the surface of the material layer (fixing means).

According to the invention, the entire surface of the material layer facing the substrate on the mounting apparatus is regarded as the receiving surface. As The surface on which there is contact with the substrate is defined as the effective contact surface. The fixing takes place at the existing vacuum, preferably at least over the effective contact surface, preferably along the receiving surface, therefore the entire surface of the material layer.

The embodiment accordingly to the invention is used predominantly, but not exclusively, for temporary fixing of substrates, preferably thin layer substrates.

In one preferred embodiment of the invention, the adhesion capacity of the material layer is defined by a surface energy of less than 0.1 J/m$^2$, especially less than 0.01 J/m$^2$, preferably less than 0.001 J/m$^2$, even more preferably less than 0.0001 J/m$^2$, ideally less than 0.00001 J/m$^2$, in order to facilitate the detachment of the substrate, and mainly the very filigreed small structures on the front of the substrate, after removal of the fixing, preferably turning off the vacuum.

Alternatively or additionally, according to one advantageous embodiment of the invention, the adhesion capacity of the contact surfaces is defined with a contact angle greater than 20°, especially greater than 50°, preferably greater than 90°, still more preferably greater than 150°. The adhesion capacity of one surface to another material can be determined using the aforementioned contact angle method. In doing so, a droplet of a known liquid, preferably water (values as claimed in the invention relative to water) is deposited on the surface which is to be measured. Using a microscope, the angle is measured exactly from the side, specifically the angle between the tangent to the droplet and the surface.

Studies have shown that materials such as Viton® or Swivel have these properties. Generally, mainly silicone-based materials are suitable for this purpose. In any case, materials can also be used which are based on polymers, carbon fibers, and/or other soft deformable elastic materials which preferably form fibers. Alternatively or in addition, according to one advantageous embodiment of the invention, the adhesion capacity of the contact surface is defined with a contact angle greater than 20°, especially greater than 50°, preferably greater than 90°, still more preferably greater than 150°. The adhesion capacity of one surface to another material can be determined using the aforementioned contact angle method. In doing so, a droplet of a known liquid, preferably water (values as claimed in the invention relative to water) (alternatively glycerin or hexadecane) is deposited on the surface which is to be measured. Using a microscope, the angle is measured exactly from the side, specifically the angle between the tangent to the droplet and the surface.

The features described for the mounting apparatus should also be considered disclosed as features of the method described below and vice versa.

An independent invention is also a method for handling a structured substrate which has structures, with the following steps, especially the following sequence:
- accommodation of the structured substrate on a receiving surface of a soft material layer, the structures being taken into the soft material layer,
- fixing of the structured substrate on the material layer, especially intensified by additional, preferably controllable fixing means
- processing of the back of the structured substrate facing away from the structures.

One embodiment of the method is preferred in which the subsequent detachment takes place, especially predominantly, preferably exclusively, by deactivation of the fixing means, especially pressure equalization on openings of the receiving surface.

Even more preferably, according to one advantageous embodiment of the invention, for detachment of the structured substrates from the material layer by the fixing means which are made as a vacuum apparatus, an overpressure in the material layer is produced which presses the structures of the structured substrate out of the material layer.

Preferably, the release/detachment of the substrate structures from the material layer is effected/supported by a force which is directed away from the material layer and which is caused by the elasticity of the material layer.

The material layer is comprised of a soft and/or porous and/or gas-permeable and/or deformable and/or flexible and/or compliant material. Advantageously, the material layer is a polymer, more preferably a silicone, most preferably one of the materials such as Viton®, Swivel or the like. It is clear to one skilled in the art in the field that any material which has the ability to accommodate structures of the disclosed height completely, and also has an adhesion capacity which is as low as possible, preferably negligibly low, can be used.

Accommodating the structures in the material can mean either the complete elastic deformation of the material around the structures or the sinking of the structures in the material. A sinking of the structures in the material is preferably enabled by fibrous and/or porous materials in which the material "yields" when the structures penetrate. This sinking of the structures of the structured substrate is ensured mainly by the explicitly disclosed materials Viton®, Swivel.

The use of the device as claimed in the invention in a debonder, preferably a SlideOff debonder, is also conceivable. A debonder is a device which when used makes it possible to separate from one another two substrates which have been temporarily bonded to one another. The fixing of structured substrates generally poses problems, especially in SlideOff debonders. Since two substrates are separated from one another by a shearing process mainly in SlideOff debonders, the shearing plane must be as flat as possible and remain flat during the entire debonding process. For this purpose, it is provided that the structures be imbedded during the debonding process; this can be easily done with the claimed embodiment. The embodiment, according to the invention, likewise facilitates the fixing of structured substrates for other debonding processes, such as the ZoneBond™ process, and for all other processes in which embedding of structures is essential or at least helpful. These debond processes are known to one skilled in the art.

A device according to the invention can also be used as part of a transport apparatus to transport structured and/or thin substrates between different positions, preferably between different modules. For example, the use of a device according to the invention as part of a robot arm would be conceivable.

Other advantages, features and details of the invention will become apparent from the following description of preferred exemplary embodiments and using the drawings which are schematic views.

DETAILED DESCRIPTION OF THE PREFERRED EMBODIMENTS

In the figures, advantages and features of the invention are labeled with the reference numbers which identify them according to embodiments of the invention. Components or features with the same function or function with the same effect are labeled with identical reference numbers.

The figures do not show the features of the invention to scale, in order to be able to represent the function of the individual features. The ratios of the individual components are in part not proportional.

Figure 1:
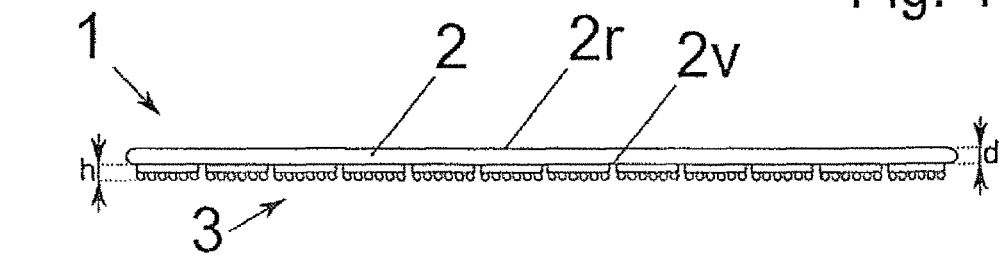
FIG. 1 shows a cross sectional view of a structured substrate.

FIG. 1 shows a structured substrate 1 comprised of a substrate 2 of thickness d and corresponding structures 3 of height h. The structures 3 can be chips, printed conductors, bumps, MEMS devices or any other type of structure which is raised off the surface of the front 2v of the substrate 2.

Figure 2:
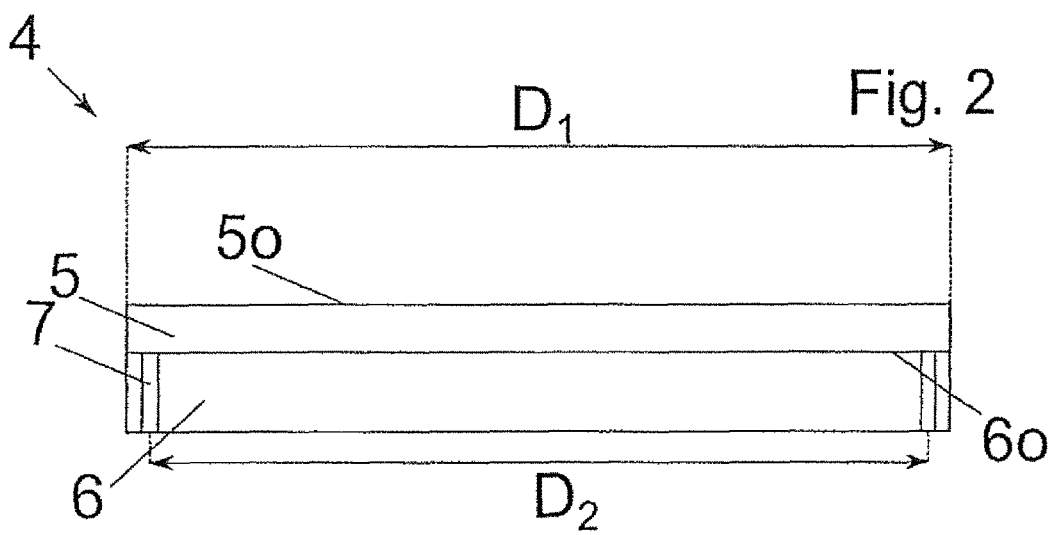
FIG. 2 shows a cross sectional view of a mounting apparatus according to the invention.
Figure 3:
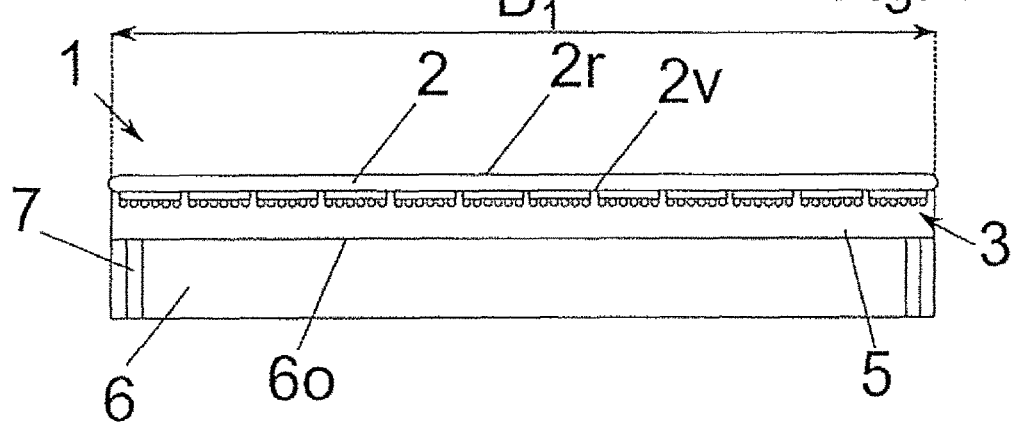
FIG. 3 shows a cross sectional view of a mounting apparatus according to the invention with a fixed structured substrate prior to a processing step.
Figure 4:
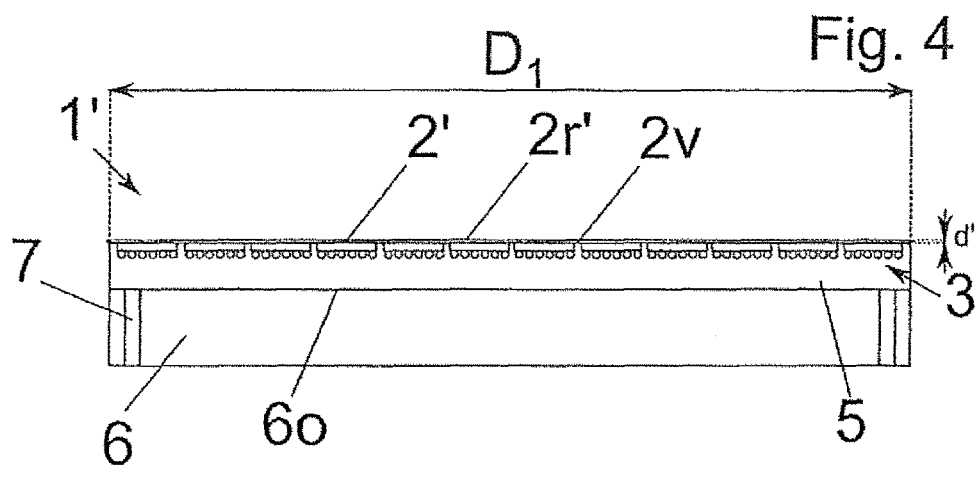
FIG. 4 shows a cross sectional view of a mounting apparatus according to the invention with a fixed structured substrate after a processing step and FIG. 5 shows a cross sectional view of a mounting apparatus according to the invention with a fixed structured substrate during a debond process.

FIG. 2 shows a mounting apparatus 4 consisting of a material layer 5 with a receiving surface 5o for accommodating the structured substrate 1 (see FIG. 1) and a base body 6 with a base body surface 6o, comprised of several openings 7.

The mounting apparatus 4 preferably has the shape of a round cylinder with openings 7 which are arranged concentrically to the mounting apparatus 4 according to FIG. 2, on a round ring with a diameter D2, or are distributed arbitrarily or uniformly over the surface. The mounting apparatus 4 in the preferred shape of a round cylinder, which is shown in the embodiment, has a diameter D1. In particular, the ratio of the diameter D2 to D1 is greater than 0.9 and less than 1, preferably greater than 0.95 and less than 1.

According to one aspect of the invention, there are at least three openings 7, preferably at least ten openings 7, even more preferably at least 20 openings 7. Furthermore, cross channels on the surface 6o of the base body 6 are conceivable which can be evacuated via the openings 7, and thus provide for the uniform distribution of the vacuum in the material layer 5. In the material layer 5, advantageously a negative pressure of less than 1 bar, more preferably of less than 800 mbar, still more preferably less than 500 mbar, most preferably less than 200 mbar, most preferably of all less than 100 mbar absolute, can be produced.

The openings 7 on the side of the base body 6 which faces away from the material layer 5 are connected or can be connected to a pressurization apparatus, which is not shown. The pressurization apparatus applies on the openings 7 a negative pressure, which pressure is distributed as uniformly as possible over the openings 7 when a structured substrate 1 is taken onto the mounting apparatus 4, so that the substrate 1 is fixed on the receiving surface 5o. Preferably, the entire volume of the porous or at least gas-permeable material layer 5 is evacuated via the openings 7 so that a uniform negative pressure arises between the structured substrate 1 which is to be fixed and the material layer 5. The structures 3 are pressed into the material layer 5 by the microstructure of the material layer 5. In doing so, the structures 3 preferably sink entirely into the material layer 5 so that the front 2v of the substrate touches the receiving surface 5o. It is also conceivable, for the structures 3 of the structured substrate 1, especially in addition or alternatively to pressurization, to be pressed into the material layer 5 by a force which is acting from the outside on the back 2r of the substrate.

After processing of the back 2r of the substrate 2, e.g., back-grinding to a thickness d' of the substrate less than 100 μm, preferably less than 50 μm, preferably less than 20 μm, the structured substrate can be removed again from the mounting apparatus 4 by its being fixed on the back 2r, 2r' of the substrate in a manner known to one skilled in the art, and by the structures 3 of the structured substrate 1, 1' being pulled out of the material layer 5, and thus detached by a correspondingly applied force normally to the back 2r, 2r' of the substrate.

Figure 5:
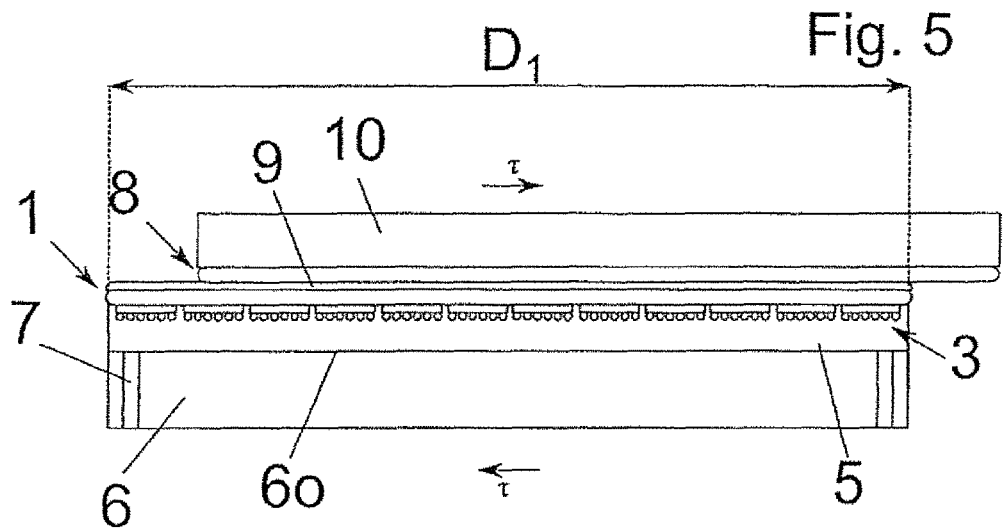

In a second embodiment according to FIG. 5, the embodiment of the mounting apparatus 4 is used for debonding. A substrate 1 is connected to a carrier substrate 8 via an adhesive layer 9. In order to detach the carrier substrate 8 from the substrate 1, the substrate 1 is fixed with the mounting apparatus 4. The carrier substrate 8 is debonded (detached) from the substrate by a shearing force t with a second fixing apparatus 10.

When a vacuum has been applied in the material layer 5 via the openings 7, before removing the structured substrate 1 the material layer 5 is first ventilated. Preferably, an overpressure is produced in the material layer 5 via the openings 7 so that the release and/or removal of the structures 3 of the structured substrate 1, 1' from the material layer 5 is supported by the overpressure.

REFERENCE NUMBER LIST 1, 1' structured substrate
2, 2' substrate
2v front of substrate
2r, 2r' back of substrate
3 structures
4 mounting apparatus
5 material layer
5o receiving surface
6 base body
6o surface of base body
7 openings
8 carrier substrate
9 adhesive
10 fixing apparatus
D, d' thickness
h height
D1 diameter
D2 diameter
t shearing force Having described the invention, the following is claimed:

1. A mounting apparatus for handling a structured substrate which has structures, said mounting apparatus comprising:
a soft material layer having a receiving surface for accommodating the structured substrate, said material layer comprised of a polymer having a modulus of elasticity that is less than 100 GPa, the structures of the structured substrate being taken at least partially into the material layer, and
fixing means for fixing the structured substrate on the receiving surface,
wherein the receiving surface is exposed to a volumetric flow passing through the material layer at least on one effective contact surface with the structured substrate.

2. The mounting apparatus as claimed in claim 1, wherein the receiving surface of the material layer has a surface energy of less than 0.1 J/m$^2$.

3. The mounting apparatus as claimed in claim 1, wherein said fixing means includes a pressurization apparatus controlled by a software-supported control apparatus for pressurization of the material layer with negative pressure and/or overpressure.

4. A method for handling a structured substrate having structures, said method comprising:
accommodating the structured substrate on a receiving surface of a soft material layer comprised of a polymer having a modulus of elasticity that is less than 100 GPa, the structures of the structured substrate being taken at least partially into the soft material layer, and
fixing the structured substrate on the material layer with a controllable fixing means,
wherein the receiving surface is exposed to a volumetric flow passing through the soft material layer at least on one effective contact surface with the structured substrate.

5. The method as claimed in claim 4, wherein after a processing step, detaching the structured substrate from the soft material layer by deactivation of the controllable fixing means.

6. The method as claimed in claim 5, wherein the processing step includes a processing of a back side of the structured substrate facing away from the structures.

7. The method as claimed in claim 5, wherein deactivation of the controllable fixing means includes pressure equalization or pressurization on the receiving surface.

8. A use of a mounting apparatus as claimed in claim 1 for handling of structured substrates.

9. The use of the mounting apparatus as claimed in claim 8, wherein the structured substrates are semiconductor substrates having a thickness d less than 100 μm.

10. The use of a mounting apparatus as claimed in claim 8, wherein the mounting apparatus is used in a debonder.

11. A mounting apparatus for handling a structured substrate having structures on one side thereof, said mounting apparatus comprised of:
- a mounting layer having a receiving surface, said mounting layer formed of a soft polymer material having a modulus of elasticity that is less than 100 GPa, and
- fixing means for fixing said one side of said structured substrate onto said receiving surface of said mounting layer, said fixing means operable to draw, at least partially, said structures on said one side of said substrate into said mounting layer,
- wherein the receiving surface is exposed to a volumetric flow passing through the material layer at least on one effective contact surface with the structured substrate.

* * * * *